(12) United States Patent
Papasakellariou et al.

(10) Patent No.: US 10,700,840 B2
(45) Date of Patent: *Jun. 30, 2020

(54) CONTROL AND DATA SIGNALING IN SC-FDMA COMMUNICATION SYSTEMS

(71) Applicant: Samsung Electronics Co., Ltd., Gyeonggi-do (KR)

(72) Inventors: Aris Papasakellariou, Dallas, TX (US); Joon-Young Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/027,859

(22) Filed: Jul. 5, 2018

(65) Prior Publication Data

US 2018/0316475 A1 Nov. 1, 2018

Related U.S. Application Data

(63) Continuation of application No. 14/863,024, filed on Sep. 23, 2015, now Pat. No. 10,038,539, which is a (Continued)

(51) Int. Cl.
*H04L 5/00* (2006.01)
*H04L 1/16* (2006.01)
(Continued)

(52) U.S. Cl.
CPC .......... *H04L 5/0053* (2013.01); *H04L 1/1671* (2013.01); *H04L 5/0055* (2013.01);
(Continued)

(58) Field of Classification Search
CPC ................................................ H04W 72/0406
See application file for complete search history.

(56) References Cited

U.S. PATENT DOCUMENTS 6,901,046 B2  5/2005  Hsu et al.
8,331,328 B2  12/2012 Papasakellariou et al.
(Continued)

FOREIGN PATENT DOCUMENTS

CN  1951042   4/2007
CN  101390323  3/2009
(Continued)

OTHER PUBLICATIONS

3GPP TSG RAN1 #49; Kobe, Japan, May 7-11, 2007.
(Continued)

*Primary Examiner* — John D Blanton
(74) *Attorney, Agent, or Firm* — The Farrell Law Firm, P.C.

(57) ABSTRACT

A method for transmitting uplink information by a user equipment in a wireless communication system, the user equipment, a method for receiving uplink information by a base station in a wireless communication system, and the base station are provided. The method for transmitting uplink information by a user equipment in a wireless communication system includes mapping a reference signal on a first symbol in a slot; mapping acknowledgement information in response to reception of downlink data on a second symbol placed directly after the first symbol in the slot; and transmitting a signal including mapped data of the reference signal and the acknowledgement information in the slot.

16 Claims, 10 Drawing Sheets

Related U.S. Application Data continuation of application No. 14/313,394, filed on Jun. 24, 2014, now Pat. No. 9,300,454, which is a continuation of application No. 13/674,626, filed on Nov. 12, 2012, now Pat. No. 8,761,130, which is a continuation of application No. 12/133,120, filed on Jun. 4, 2008, now Pat. No. 8,331,328.

(60) Provisional application No. 60/942,843, filed on Jun. 8, 2007.

(51) Int. Cl.
    *H04W 72/04*     (2009.01)
    *H04L 1/00*     (2006.01)

(52) U.S. Cl.
    CPC ....... *H04W 72/0406* (2013.01); *H04L 1/0026* (2013.01); *H04L 5/0007* (2013.01)

(56) References Cited

U.S. PATENT DOCUMENTS

| | | |
|---|---|---|
| 2003/0232622 A1 | 12/2003 | Seo |
| 2005/0013263 A1* | 1/2005 | Kim ................. H04L 1/0068 370/320 |
| 2005/0232138 A1 | 10/2005 | Byun et al. |
| 2007/0014272 A1 | 1/2007 | Palanki et al. |
| 2007/0097981 A1 | 5/2007 | Papasakellariou |
| 2007/0171849 A1* | 7/2007 | Zhang ................. H04L 1/0026 370/310 |
| 2007/0195740 A1* | 8/2007 | Bhushan .............. H04B 7/2656 370/335 |
| 2007/0297386 A1 | 12/2007 | Zhang et al. |
| 2008/0075060 A1 | 3/2008 | Tiirola et al. |
| 2008/0170516 A1 | 7/2008 | Carmon |
| 2008/0219235 A1 | 9/2008 | Ma et al. |
| 2008/0232300 A1 | 9/2008 | McCoy et al. |
| 2008/0310530 A1 | 12/2008 | Imamura et al. |
| 2009/0262653 A1* | 10/2009 | Toda ................. H04L 1/0026 370/252 |
| 2010/0165956 A1 | 7/2010 | Razzell |
| 2015/0318961 A1 | 11/2015 | Li et al. |

FOREIGN PATENT DOCUMENTS

| | | |
|---|---|---|
| EP | 1 646 163 | 4/2006 |
| EP | 1 720 310 | 11/2006 |
| EP | 1 806 867 | 7/2007 |
| EP | 1 901 459 | 3/2008 |
| KR | 1020040063324 | 7/2004 |
| WO | WO 2007/013559 | 2/2007 |

OTHER PUBLICATIONS

3GPP TSG RAN WG1 Meeting #49; Kobe, Japan, May 7-11, 2007.
3GPP TS 36.211 V1.0.0 (Mar. 2007).
3GPP TS 36.212 V1.0.0 (Mar. 2007).
Ericsson, "Uplink CQI Reporting", R1-072474, TSG-RAN WG1 #49, May 2, 2007.
Samsung, "Uplink Control Signal Transmission in Presence of Data", R1-072224, 3GPP TSG RAN WG1 Meeting #49, May 2, 2007.
Chinese Office Action dated Sep. 29, 2015 issued in counterpart application No. 201310285519.4, 19 pages.
Nokia ("ACK/NACK transmision with UL data", 3GPP TSG RAN WG1 Meeitng #49 Kobe, Japan, May 7-11, 2007).

* cited by examiner

CONTROL AND DATA SIGNALING IN SC-FDMA COMMUNICATION SYSTEMS

PRIORITY

This Continuation application claims priority under 35 U.S.C. § 120 to U.S. patent application Ser. No. 14/863,024, filed on Sep. 23, 2015, which is a Continuation Application of U.S. Pat. No. 9,300,454, issued on Mar. 29, 2016, which is a Continuation Application of U.S. Pat. No. 8,761,130, issued on Jun. 24, 2014, which is a Continuation Application of U.S. Pat. No. 8,331,328, issued on Dec. 11, 2012, and claims priority under 35 U.S.C. § 119(e) to U.S. Provisional Patent Application Ser. No. 60/942,843, filed Jun. 8, 2007, the entire contents of each of which are incorporated herein by reference.

BACKGROUND OF THE INVENTION

1. Field of the Invention

The present invention is directed, in general, to wireless communication systems and, more specifically, to multiplexing control and data information in single-carrier frequency division multiple access (SC-FDMA) communication systems.

2. Description of the Related Art

In particular, the present invention considers the transmission of positive or negative acknowledgement bits (ACK or NAK, respectively) and channel quality indicator (CQI) bits together with data information bits in an SC-FDMA communications system and is further considered in the development of the 3rd Generation Partnership Project (3GPP) Evolved Universal Terrestrial Radio Access (E-UTRA) long term evolution (LTE). The invention assumes the uplink (UL) communication corresponding to the signal transmission from mobile user equipments (UEs) to a serving base station (Node B). A UE, also commonly referred to as a terminal or a mobile station, may be fixed or mobile and may be a wireless device, a cellular phone, a personal computer device, a wireless modem card, etc. A Node B is generally a fixed station and may also be called a base transceiver system (BTS), an access point, or some other terminology. The ACK/NAK bits and CQI bits may also be referred to simply as control information bits.

The ACK or NAK bits are in response to the correct or incorrect, respectively, data packet reception in the downlink (DL) of the communication system, which corresponds to signal transmission from the serving Node B to a UE. The CQI transmitted from a reference UE is intended to inform the serving Node B of the channel conditions the UE experiences for signal reception, enabling the Node B to perform channel-dependent scheduling of DL data packets. Either or both of the ACK/NAK and CQI may be transmitted by a UE in the same transmission time interval (TTI) with data or in a separate TTI with no data. The disclosed invention considers the former case, which may also be referred to as data-associated transmission of the ACK/NAK and/or CQI.

The UEs are assumed to transmit control and data bits over a TTI corresponding to a sub-frame. FIG. 1 illustrates a block diagram of the sub-frame structure 110 assumed in the exemplary embodiment of the disclosed invention. The sub-frame includes two slots. Each slot 120 further includes seven symbols and each symbol 130 further includes of a cyclic prefix (CP) for mitigating interference due to channel propagation effects, as it is known in the art. The signal transmission in the two slots may be in the same part or it may be at two different parts of the operating bandwidth. Furthermore, the middle symbol in each slot carries the transmission of reference signals (RS) 140, also known as pilot signals, which are used for several purposes including for providing channel estimation for coherent demodulation of the received signal.

The transmission bandwidth (BW) is assumed to include frequency resource units, which will be referred to herein as resource blocks (RBs). An exemplary embodiment assumes that each RB includes 12 sub-carriers and UEs are allocated a multiple N of consecutive RBs 150. Nevertheless, the above values are only illustrative and not restrictive to the invention.

An exemplary block diagram of the transmitter functions for SC-FDMA signaling is illustrated in FIG. 2. Coded CQI bits 205 and coded data bits 210 are multiplexed 220. If ACK/NAK bits also need to be multiplexed, the exemplary embodiment assumes that data bits are punctured to accommodate ACK/NAK bits 230. Alternatively, CQI bits (if any) may be punctured or different rate matching, as it is known in the art, may apply to data bits or CQI bits to accommodate ACK/NAK bits. The discrete Fourier transform (DFT) of the combined data bits and control bits is then obtained 240, the sub-carriers 250 corresponding to the assigned transmission bandwidth are selected 255, the inverse fast Fourier transform (IFFT) is performed 260 and finally the cyclic prefix (CP) 270 and filtering 280 are applied to the transmitted signal 290.

Alternatively, as illustrated in FIG. 3, in order to transmit the control (ACK/NAK and/or CQI) bits 310, puncturing of coded data bits 320 may apply 330 (instead of also applying rate matching as in FIG. 2) and certain coded data bits (for example, the parity bits in case of turbo coding) may be replaced by control bits. The discrete Fourier transform (DFT) 340 of the combined bits is then obtained, the sub-carriers 350 corresponding to the assigned transmission bandwidth are selected 355 (localized mapping is assumed but distributed mapping may also be used), the inverse fast Fourier transform (IFFT) 360 is performed and finally the cyclic prefix (CP) 370 and filtering 380 are applied to the transmitted signal 390.

This time division multiplexing (TDM) illustrated in FIG. 2 and FIG. 3 between control (ACK/NAK and/or CQI) bits and data bits prior to the DFT is necessary to preserve the single carrier property of the transmission. Zero padding, as it is known in the art, is assumed to be inserted by a reference UE in sub-carriers used by another UE and in guard sub-carriers (not shown). Moreover, for brevity, additional transmitter circuitry such as digital-to-analog converter, analog filters, amplifiers, and transmitter antennas are not illustrated in FIG. 2 and FIG. 3. Similarly, the encoding process for the data bits and the CQI bits, as well as the modulation process for all transmitted bits, are well known in the art and are omitted for brevity.

At the receiver, the inverse (complementary) transmitter operations are performed. This is conceptually illustrated in FIG. 4 where the reverse operations of those illustrated in FIG. 2 are performed. As it is known in the art (not shown for brevity), an antenna receives the radio-frequency (RF) analog signal and after further processing units (such as filters, amplifiers, frequency down-converters, and analog-to-digital converters) the digital received signal 410 passes through a time windowing unit 420 and the CP is removed 430. Subsequently, the receiver unit applies an FFT 440, selects 445 the sub-carriers 450 used by the transmitter, applies an inverse DFT (IDFT) 460, extracts the ACK/NAK bits and places respective erasures for the data bits 470, and de-multiplexes 480 the data bits 490 and CQI bits 495. As for the transmitter, well known in the art receiver functionalities such as channel estimation, demodulation, and decoding are not shown for brevity and they are not material to the present invention.

The control bits typically require better reception reliability than the data bits. This is primarily because hybrid-automatic-repeat-request (HARQ) usually applies to data transmission but not to control transmission. Additionally, ACK/NAK bits typically require better reception reliability that CQI bits as erroneous reception of ACK/NAK bits has more detrimental consequences to the overall quality and efficiency of communication than does erroneous reception for the CQI bits.

The size of resources in a transmission sub-frame required for control signaling for a given desired reception reliability depend on the channel conditions the signal transmission from a UE experiences and in particular, on the signal-to-interference and noise ratio (SINR) of the received signal at the serving Node B.

There is a need to determine the placement of control bits when transmitted in the same sub-frame with data bits so that better reception reliability is provided for the control bits than for the data bits.

There is another need to determine the placement of acknowledgement bits relative to channel quality indication bits, in case they are simultaneously multiplexed, in order to provide better reception reliability for the former.

There is another need to dimension the resources required for the transmission of acknowledgement bits, in a sub-frame also containing data bits, as a function of the channel conditions experienced by the signal transmission from a UE.

SUMMARY OF THE INVENTION

Accordingly, the present invention has been designed to solve the above-mentioned problems occurring in the prior art, and embodiments of the invention provide an apparatus and a method for allocating resources in a sub-frame for the transmission of control bits and data bits.

In accordance with an aspect of the present invention, a method for transmitting uplink information by a user equipment in a wireless communication system is provided. The method for transmitting uplink information by a user equipment in a wireless communication system includes mapping a reference signal on a first symbol in a slot; mapping acknowledgement information in response to reception of downlink data on a second symbol placed directly after the first symbol in the slot; and transmitting a signal including mapped data of the reference signal and the acknowledgement information in the slot.

In accordance with another aspect of the present invention, a UE for transmitting uplink information in a wireless communication system is provided. The UE includes a transceiver; and a controller coupled with the transceiver and configured to map a reference signal on a first symbol in a slot; map acknowledgement information in response to reception of downlink data on a second symbol placed directly after the first symbol in the slot; and transmit a signal including mapped data of the reference signal and the acknowledgement information in the slot.

In accordance with an aspect of the present invention, a method for receiving uplink information by a base station in a wireless communication system is provided. The method includes receiving a signal including mapped data of a reference signal and acknowledgement information in a slot; de-mapping the reference signal on a first symbol in the slot; and de-mapping the acknowledgement information in response to transmission of downlink data on a second symbol placed directly after the first symbol in the slot.

In accordance with another aspect of the present invention, a base station for receiving uplink information in a wireless communication system is provided. The base station includes a transceiver; and a controller coupled with the transceiver and configured to receive a signal including mapped data of a reference signal and acknowledgement information in a slot; de-map the reference signal on a first symbol in the slot; and de-map the acknowledgement information in response to transmission of downlink data on a second symbol placed directly after the first symbol in the slot.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF THE EXEMPLARY EMBODIMENTS

The present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Additionally, although the invention assumes a single-carrier frequency division multiple access (SC-FDMA) communication system, it also applies to all FDM systems in general and to OFDMA, OFDM, FDMA, DFT-spread OFDM, DFT-spread OFDMA, single-carrier OFDMA (SC-OFDMA), and single-carrier OFDM in particular.

Basically, the system and methods of the embodiments of the present invention solve problems related to the need for providing the desired reliability for the reception of control signaling under indicative transmission sub-frame structures and provide additional advantages such as the reduction of resource overhead for the transmission of control signals.

Figure 1:
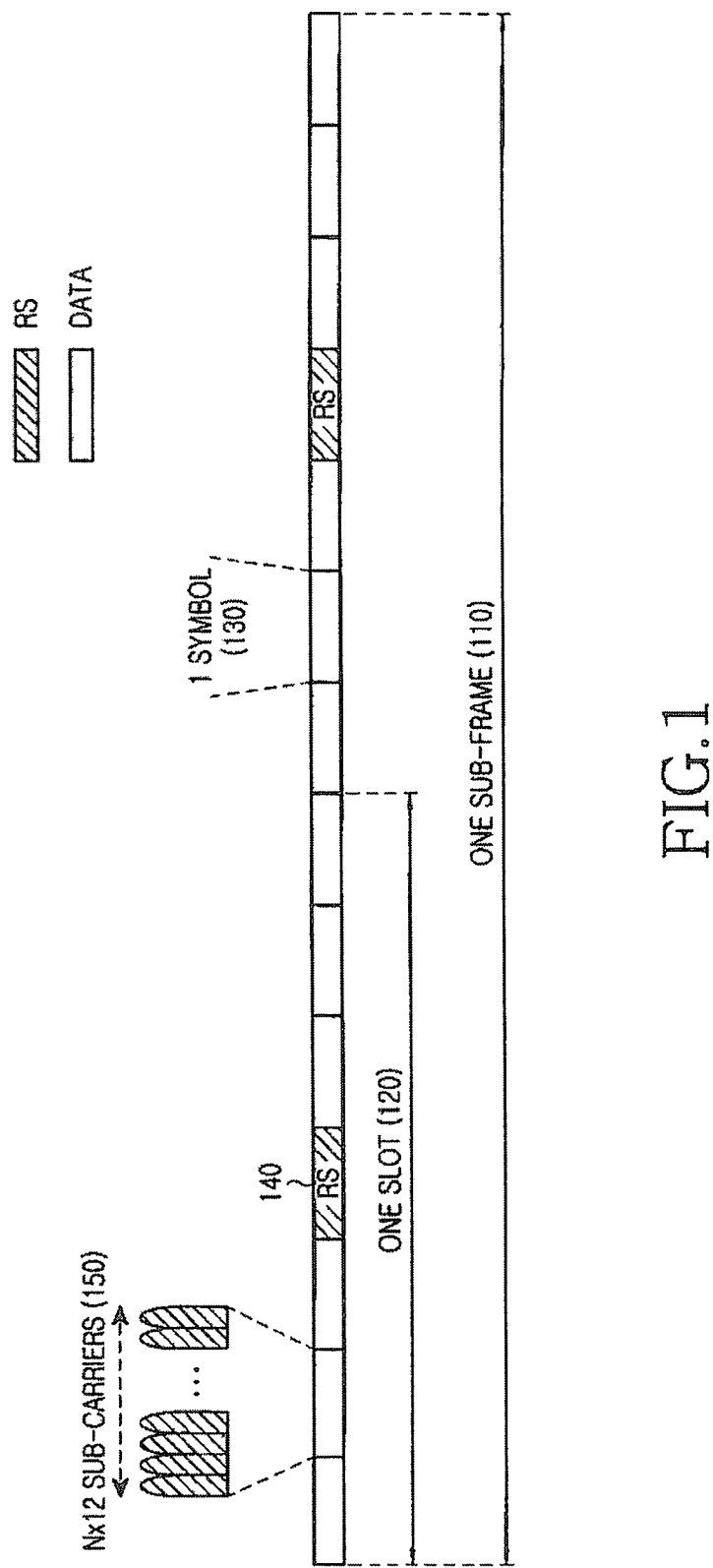
FIG. 1 is a block diagram illustrating an exemplary sub-frame structure for the SC-FDMA communication system.
Figure 2:
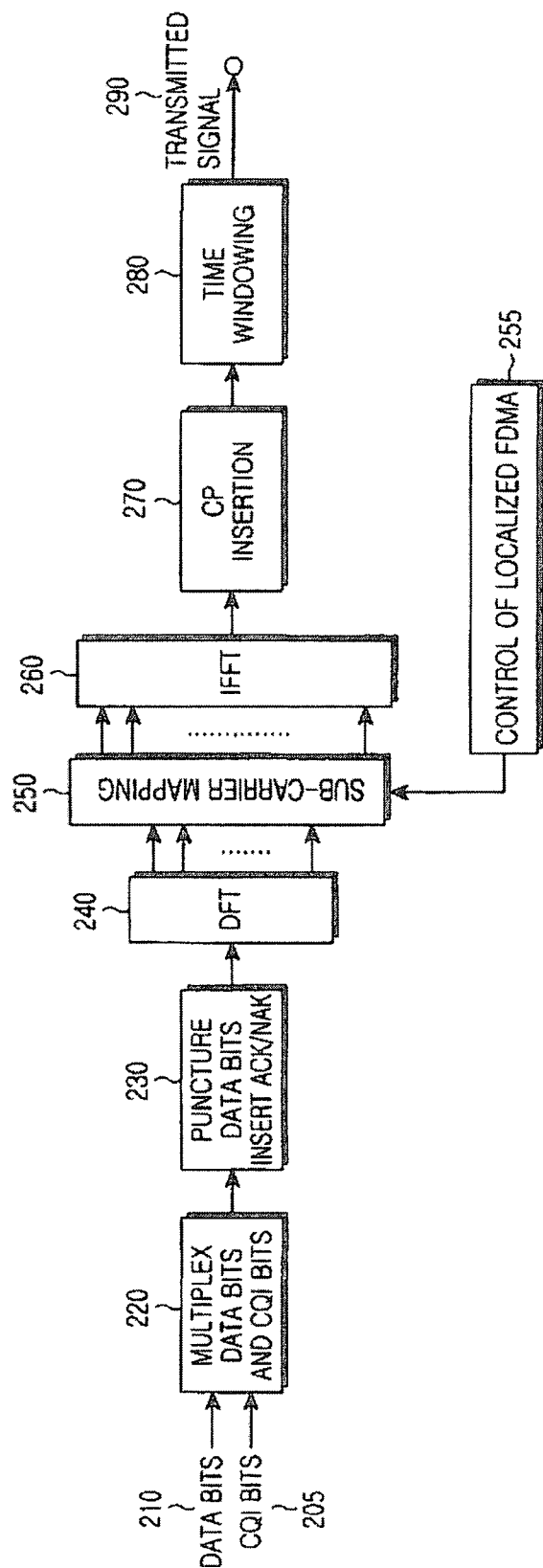
FIG. 2 is a block diagram illustrative of a first exemplary SC-FDMA transmitter for multiplexing data bits, CQI bits, and ACK/NAK bits in a transmission sub-frame.
Figure 3:
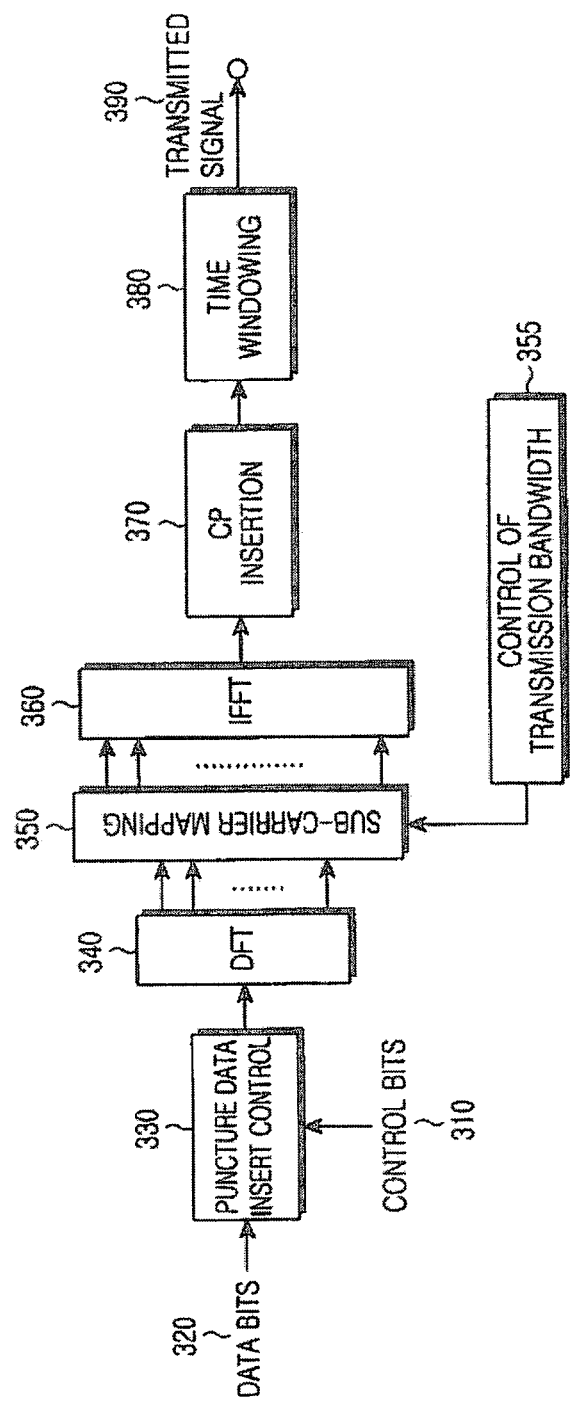
FIG. 3 is another block diagram illustrative of a second exemplary SC-FDMA transmitter or multiplexing data bits, CQI bits, and ACK/NAK bits in a transmission sub-frame.
Figure 4:
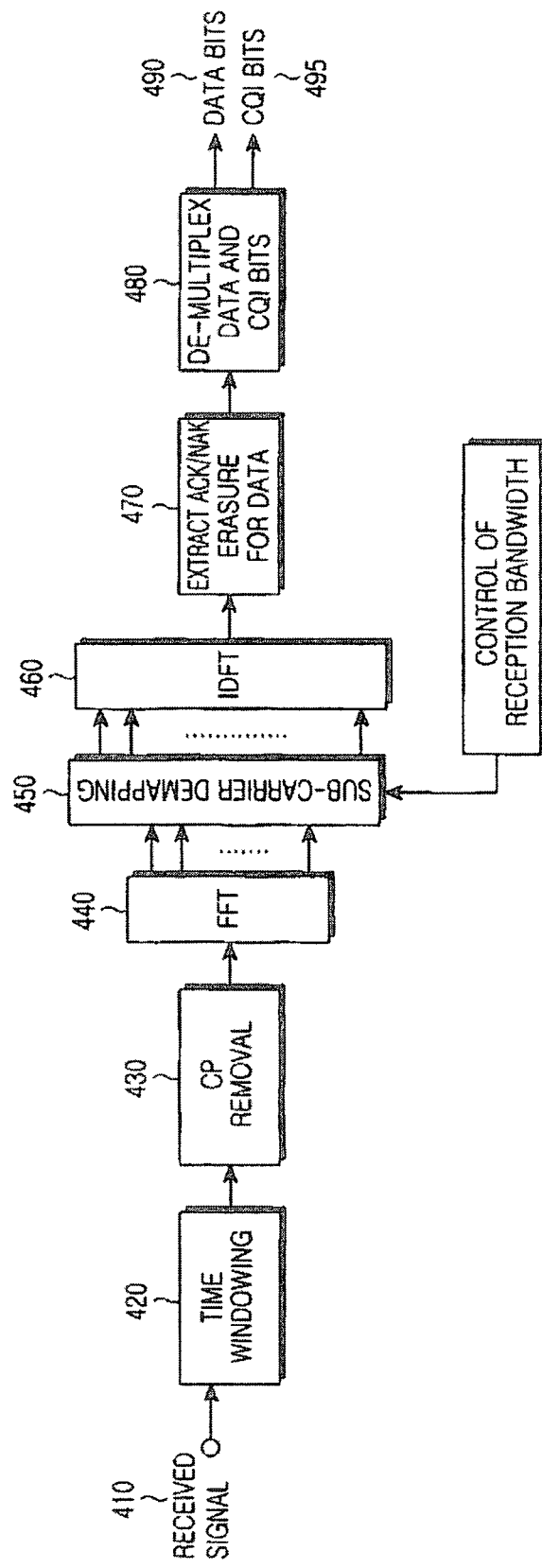
FIG. 4 is a block diagram illustrative of an exemplary SC-FDMA receiver, corresponding to the first exemplary SC-FDMA transmitter, for de-multiplexing data bits, CQI bits, and ACK/NAK bits in a reception sub-frame.

A first observation for the sub-frame structure illustrated in FIG. 1 is that the reference signal (RS) exists only in the middle symbol of each slot. In case of a mobile terminal, or user equipment (UE), with high speed, this can substantially degraded channel estimation for symbols located further away from the RS (that is, for symbols near the beginning and end of each slot) due to the faster variation of the channel medium as the UE velocity increases. This may be acceptable for data transmission that is coded, which has typically a relatively large target block error rate (BLER), such as 10% or above, and can benefit from retransmissions though a conventional HARQ process. Conversely, the CQI and particularly the ACK/NAK have much stricter performance requirements, HARQ typically does not apply to the corresponding transmissions, and providing an accurate channel estimate is essential in achieving the desired reception reliability.

A brief set of simulation results for the un-coded (raw) bit error rate (BER) is provided to illustrate the impact of inaccurate channel estimation on the reception quality as a function of the symbol position in the slot and the UE speed. Table 1 provides the simulation setup under optimistic conditions for the performance loss due to imperfect channel estimation at symbols further away from the RS for the following reasons:

Transmission bandwidth is 1 RB. This maximizes power per sub-carrier.
Channel frequency selectivity is large and there are 2 uncorrelated Node B receiver antennas. This maximizes the slope of the un-coded (raw) BER curve and minimizes the relative performance loss due to imperfect channel estimation for a target BER value.
Operating signal-to-interference and noise ratio (SINR) is large. This minimizes the impact of inaccurate channel estimation.

TABLE 1

Simulation Assumptions

| Parameters | Assumptions |
| --- | --- |
| Operating Bandwidth @ Carrier Frequency | 5 MHz @ 2.6 GHz |
| Modulation Scheme | Quadrature Phase Shift Keying (QPSK) |
| Data Transmission Bandwidth (BW) | 1 RB |
| UE Speed | 3, 30, 120 and 350 Kilometers per hour (Kmph) |
| Transmission Type | Localized (at same RB) over the sub-frame at 3, 30 Kmph<br>Frequency Hopping Between Slots at 120 and 350 Kmph |

TABLE 1-continued

Simulation Assumptions

| Parameters | Assumptions |
| --- | --- |
| Channel Model | GSM - Terrestrial-Urban with 6 paths (TU6) |
| Number of Node B Receiver Antennas | 2 |
| Number of UE Transmitter Antennas | 1 |

Figure 5:
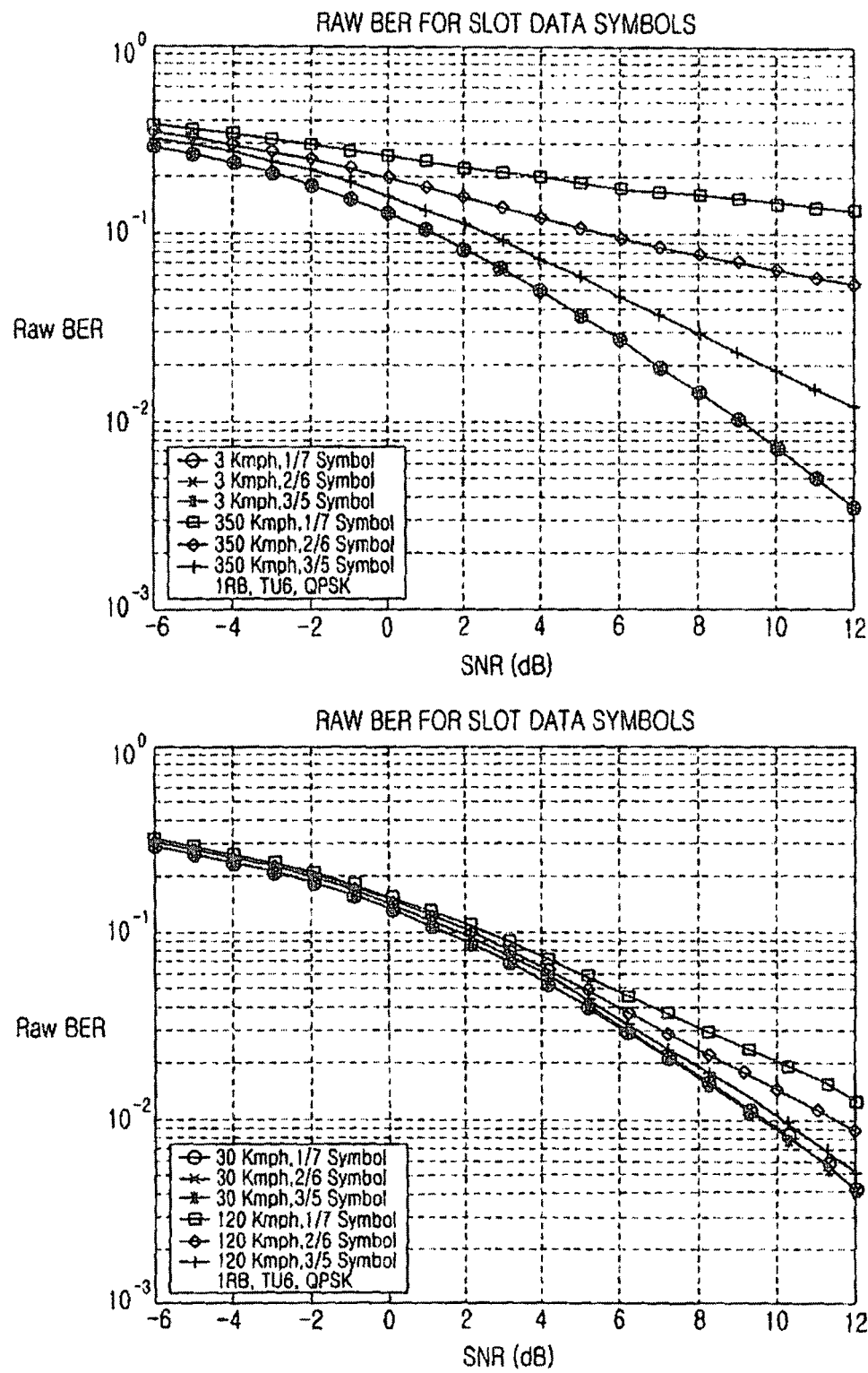
FIG. 5 presents un-coded bit error rate (BER) results as a function of the symbol number (symbol position) in the sub-frame slot and the UE velocity.

FIG. 5 presents the un-coded BER. At symbol locations symmetric to the RS, the BER is typically the same. At 120 Kmph and 350 Kmph, the transmission in the first slot is assumed to occur at a different BW than the one in the second slot (frequency hopped transmission per slot). As only 1 RS per slot is available for channel estimation, the BER is the same at symbols symmetric (equidistant) to the RS. At low speeds, such as 3 Kmph, this is also the case because the channel does not change over the sub-frame duration. Some small variability does exist for medium UE speeds, such as 30 Kmph, but, for simplicity, the average BER of symbols equidistant to the RS is only shown.

Even under the previous optimistic assumptions for the un-coded (raw) BER degradation due to degraded channel estimation at symbols further away from the RS, at 350 Kmph the BER saturates at the $1^{st}/7^{th}$ and $2^{nd}/6^{th}$ symbols. However, the impact on the BER of the $3^{rd}/5^{th}$ symbols is rather contained and saturation is avoided (the difference relative to the BER at 3 Kmph is also partly due to the fact that the latter uses both RS in the sub-frame for channel estimation which therefore effectively operates with twice as much SINR). The BER at 120 Kmph is also degraded by about 3 dB for the $1^{st}/7^{th}$ symbols and by about 1.5 dB for the $2^{nd}/6^{th}$ symbols relative to the one of the $3^{rd}/5^{th}$ symbols at about the 1% point. Obviously, due to the flattening of the BER curves for the $1^{st}/7^{th}$ and $2^{nd}/6^{th}$ symbols, the degradation will be much larger for BER operating points below 1% as it is typically needed for the NAK reception.

Based on the results in FIG. 5 it becomes apparent that the control transmission should be placed with priority immediately next to the RS.

Figure 6:
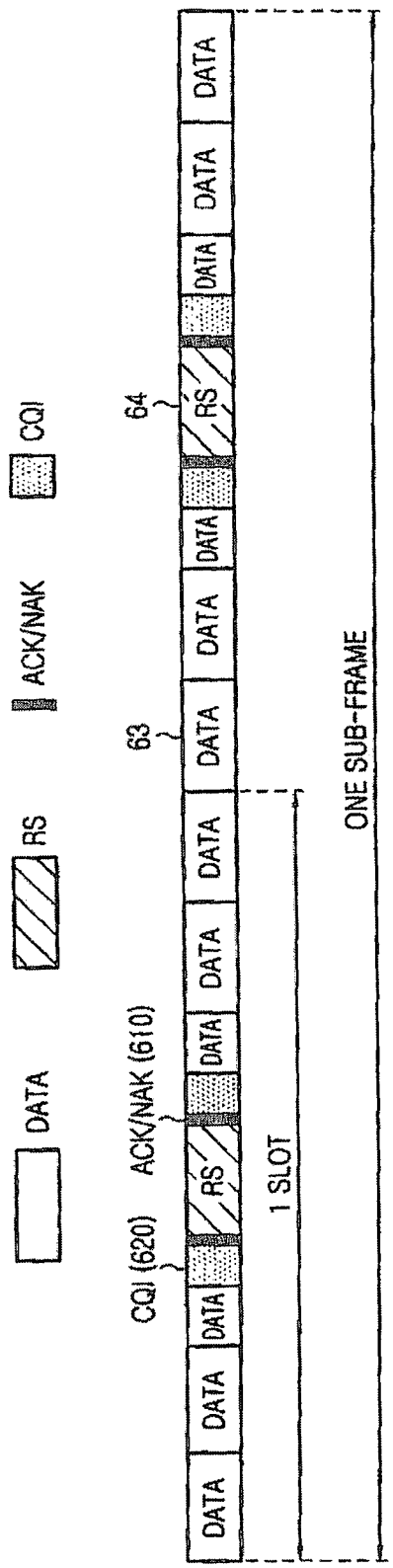
FIG. 6 is a block diagram illustrating a first method for the selection of the sub-frame symbols carrying the transmission of CQI bits and ACK/NAK bits.

FIG. 6 illustrates such a placement when a UE transmits both ACK/NAK bits 610 and CQI bits 620 during a sub-frame. These control bits are placed on symbols next to the RS 630 while the data bits 640 are included in symbols transmitted over the entire sub-frame (with the obvious exception of the symbols carrying the RS transmission). Due to the requirement for better reception reliability, the ACK/NAK bits are placed closer to the RS than the CQI bits.

Figure 7:
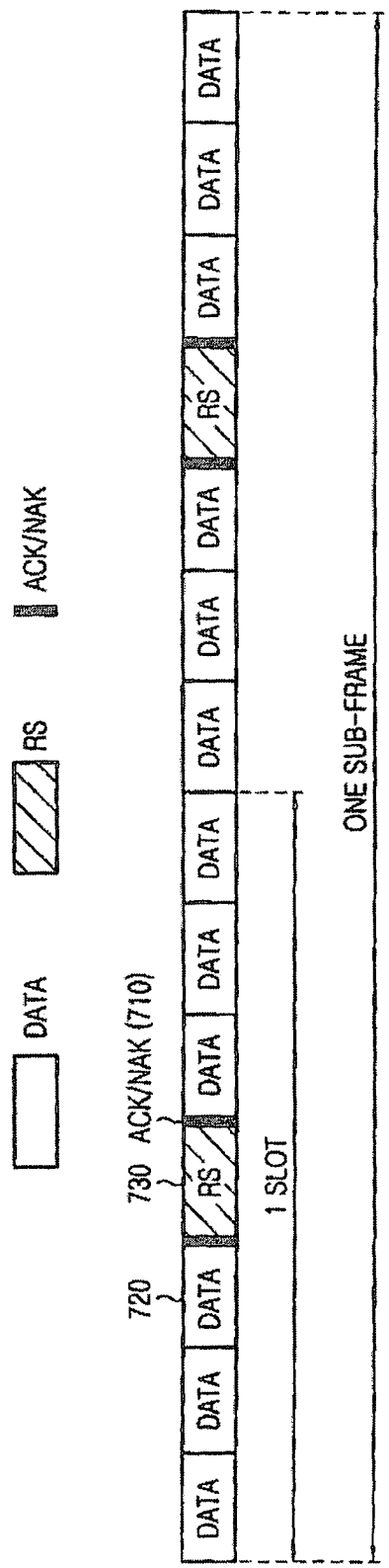
FIG. 7 is a block diagram illustrating a first method for the selection of the sub-frame symbols carrying the transmission of ACK/NAK bits.

FIG. 7 illustrates the case in which the UE transmits only ACK/NAK bits 710 together with data bits 720 during a sub-frame. The ACK/NAK bits are placed at the two symbols next to the RS 730 in each of the two sub-frame slots while the data bits are included in symbols transmitted over the entire sub-frame.

Figure 8:
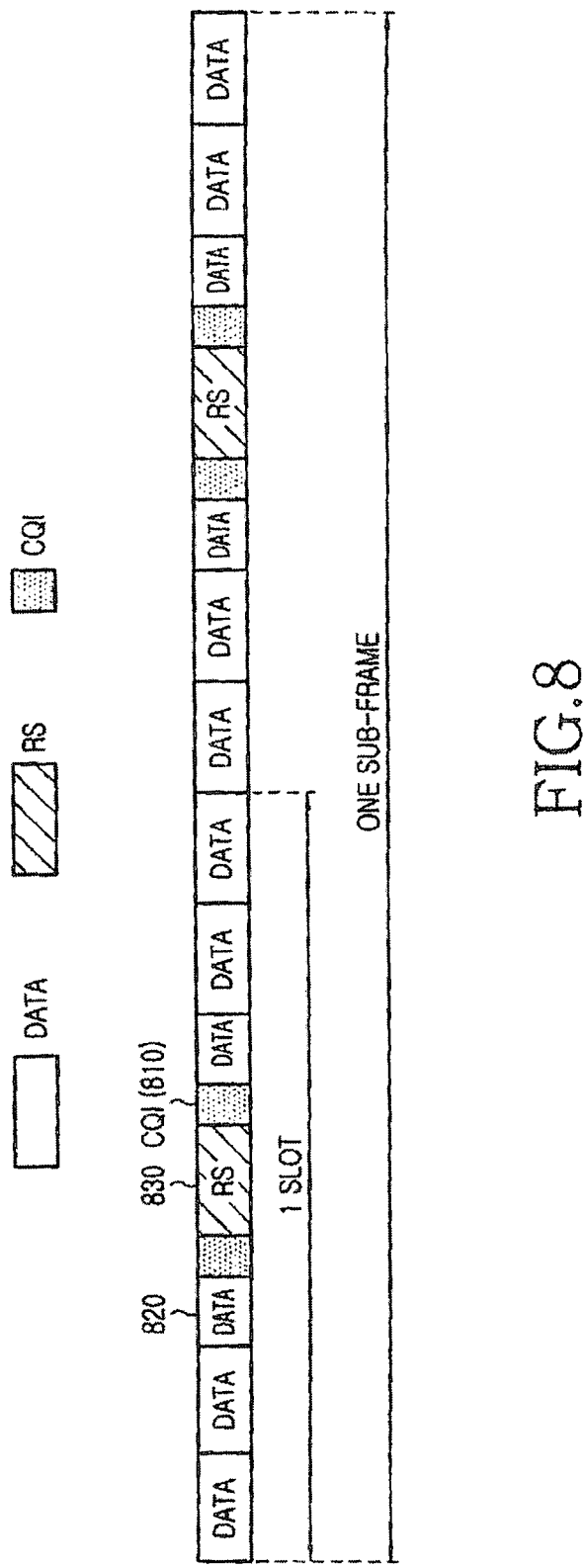
FIG. 8 is a block diagram illustrating a first method for the selection of the sub-frame symbols carrying the transmission of CQI bits.

FIG. 8 illustrates the case in which the UE transmits only CQI bits 810 together with data bits 820 during a sub-frame. The CQI bits are placed at the two symbols next to the RS 830 in each of the two sub-frame slots while the data bits are included in symbols transmitted over the entire sub-frame.

Figure 9:
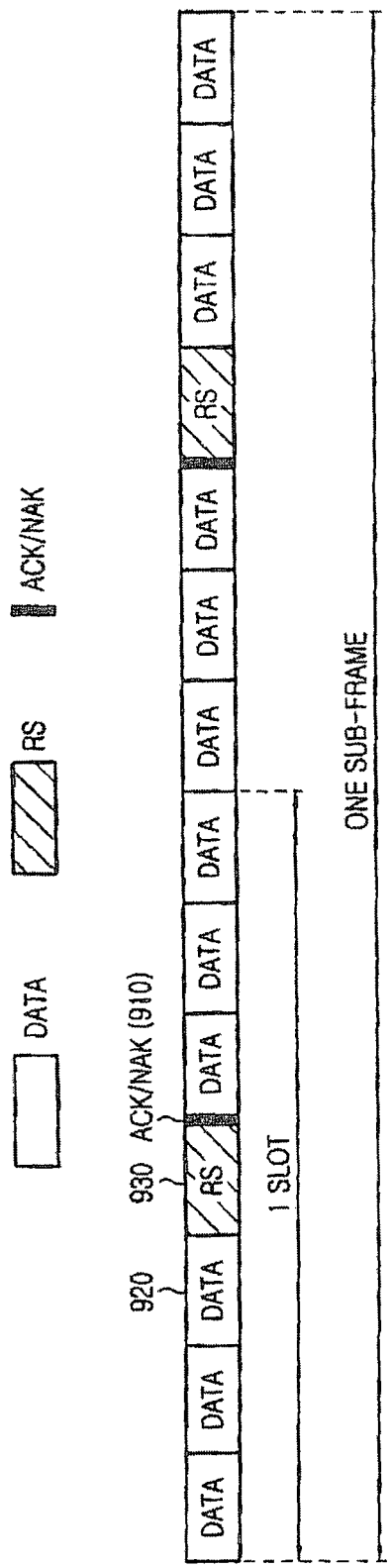
FIG. 9 is a block diagram illustrating a second method for the selection of the sub-frame symbols carrying the transmission of ACK/NAK bits with reduced overhead.

To minimize channel estimation losses, the ACK/NAK bits should be placed with priority in the symbol after the first symbol carrying the RS. This does not impact demodulation latency as a channel estimate is available only after this first RS symbol. To address low SINR or coverage issues, the ACK/NAK bits can also be placed in the symbol before the second RS. For medium UE speeds, this second placement of ACK/NAK bits benefits from improved channel estimation and time diversity while for high UE speeds, it benefits from frequency and time diversity. This is illustrated in FIG. 9 where the ACK/NAK bits 910 are placed in only one symbol next to the RS 920 in each slot, these two symbols (one in each slot) are located between the two RS, while the data bits 930 are transmitted throughout the sub-frame (with the obvious exception of the symbols carrying the RS).

Provisioning for the transmission of ACK/NAK bits in the sub-carriers over 2 symbols is typically adequate to achieve the desired BER for the ACK reception. Nevertheless, because the NAK reception has typically a lower BER target, it is appropriate to have the ACK/NAK transmission over the number of sub-carriers in 1 symbol in each slot. If further ACK/NAK transmissions are needed, because of low SINR or coverage issues, the other symbols next to the RS in the 2 slots may also be used as illustrated in FIG. 6 and FIG. 7.

Figure 10:
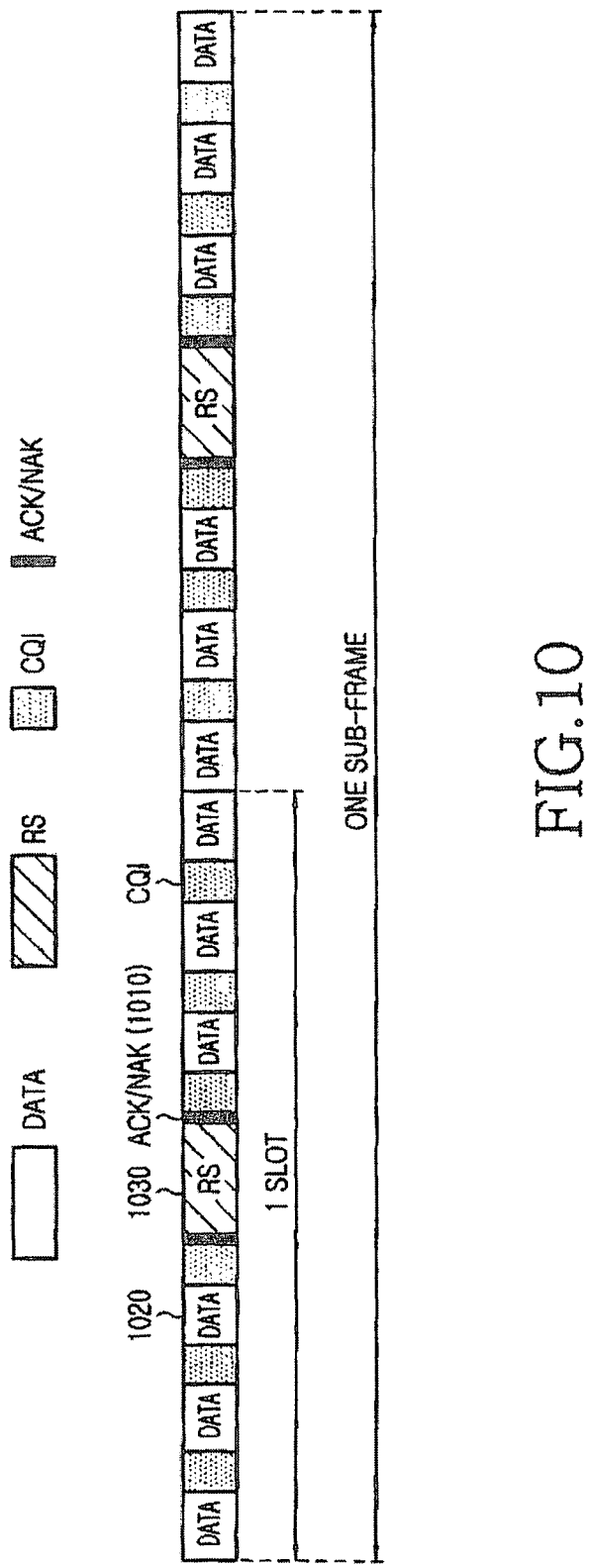
FIG. 10 is a block diagram illustrating a second method for the selection of the sub-frame symbols carrying the transmission CQI bits and ACK/NAK bits.

Depending on the number of information bits carried in the CQI reporting, which are typically several times more than the ACK/NAK information bits, the symbols immediately adjacent to the RS may not suffice for the CQI transmission, especially for coverage or SINR limited UEs that are also typically assigned small bandwidth allocations (a small number of RBs). In such cases, the CQI transmission may also extend to one or more symbols that are adjacent to the symbols also carrying CQI information that are adjacent to the symbols carrying the RS. An exemplary embodiment of this principle is illustrated in FIG. 10. As previously discussed, the location of the ACK/NAK bits 1010 remains in symbols next to the RS 1030 but the CQI bits 1020 are located in symbols throughout the transmission sub-frame, similarly to the data symbols 1040.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for transmitting uplink information by a user equipment in a wireless communication system, the method comprising:
    mapping a reference signal on a first symbol in an uplink channel;
    mapping acknowledgement information in response to reception of downlink data on a second symbol first placed after the first symbol in the uplink channel; and
    transmitting a signal including mapped data of the reference signal and the acknowledgement information in the uplink channel,
    wherein a part of channel quality indicator (CQI) information is further mapped on at least one symbol, except for the first symbol, in case that the CQI information is present for transmission on the uplink channel.

2. The method of claim 1, wherein the reference signal is used for demodulation.

3. The method of claim 1, wherein the acknowledgement information and the part of the CQI information are respectively multiplexed on corresponding resource elements in the second symbol of the uplink channel.

4. The method of claim 1, wherein one or more symbols, except the first and second symbols, are additionally used to map the acknowledgement information in case that further transmission of the acknowledgement information is needed.

5. A user equipment (UE) for transmitting uplink information in a wireless communication system, the UE comprising:
    a transceiver; and
    a controller coupled with the transceiver and configured to:
        map a reference signal on a first symbol in an uplink channel;
        map acknowledgement information in response to reception of downlink data on a second symbol, first placed after the first symbol in the uplink channel; and
        transmit a signal including mapped data of the reference signal and the acknowledgement information in the uplink channel,
    wherein a part of channel quality indicator (CQI) information is further mapped on at least one symbol, except for the first symbol, in case that the CQI information is present for transmission on the uplink channel.

6. The UE of claim 5, wherein the reference signal is used for demodulation.

7. The UE of claim 6, wherein the acknowledgement information and the part of the CQI information are respectively multiplexed on corresponding resource elements in the second symbol of the uplink channel.

8. The UE of claim 5, wherein the controller is further configured to additionally use one or more symbols, except the first and second symbols, to map the acknowledgement information in case that further transmission of the acknowledgement information is needed.

9. A method for receiving uplink information by a base station in a wireless communication system, the method comprising:
    receiving a signal including mapped data of a reference signal and acknowledgement information in an uplink channel;
    de-mapping the reference signal on a first symbol in the uplink channel; and
    de-mapping the acknowledgement information in response to transmission of downlink data on a second symbol, first placed after the first symbol in the uplink channel,
    wherein a part of channel quality indicator (CQI) information is further de-mapped on at least one symbol, except for the first symbol, in case that the CQI information is present for reception on the uplink channel.

10. The method of claim 9, wherein the reference signal is used for demodulation.

11. The method of claim 9, wherein the acknowledgement information and the part of the CQI information are respectively de-multiplexed on corresponding resource elements in the second symbol of the uplink channel.

12. The method of claim 9, wherein one or more symbols, except the first and second symbols, are additionally used to de-map the acknowledgement information in case that further reception of the acknowledgement information is needed.

13. A base station for receiving uplink information in a wireless communication system, the base station comprising:
    a transceiver; and
    a controller coupled with the transceiver and configured to:

receive a signal including mapped data of a reference signal and acknowledgement information in an uplink channel;

de-map the reference signal on a first symbol in the uplink channel; and de-map the acknowledgement information in response to transmission of downlink data on a second symbol first placed after the first symbol in the uplink channel, wherein a part of channel quality indicator (CQI) information is further de-mapped on at least one symbol, except for the first symbol, in case that the CQI information is present for reception on the uplink channel.

14. The base station of claim 13, wherein the reference signal is used for demodulation.

15. The base station of claim 13, wherein the acknowledgement information and the part of the CQI information are respectively de-multiplexed on corresponding resource elements in the second symbol of the uplink channel.

16. The base station of claim 13, wherein the controller is further configured to additionally use one or more symbols, except the first and second symbols, to de-map the acknowledgement information in case that further reception of the acknowledgement information is needed.

* * * * *